July 25, 1950 W. L. O. GRAVES 2,516,563
MAGNETIC AMPLIFIER FOR INDUCTIVE LOADS
Filed April 19, 1948
Fig. 1.
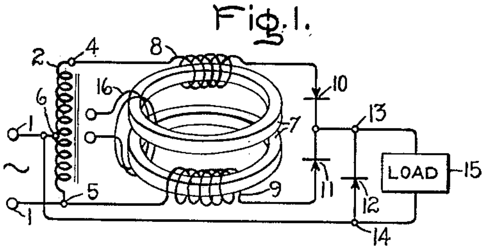
PRIOR ART Fig. 2.
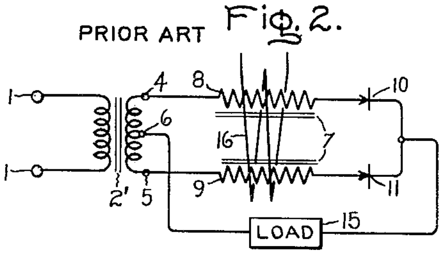
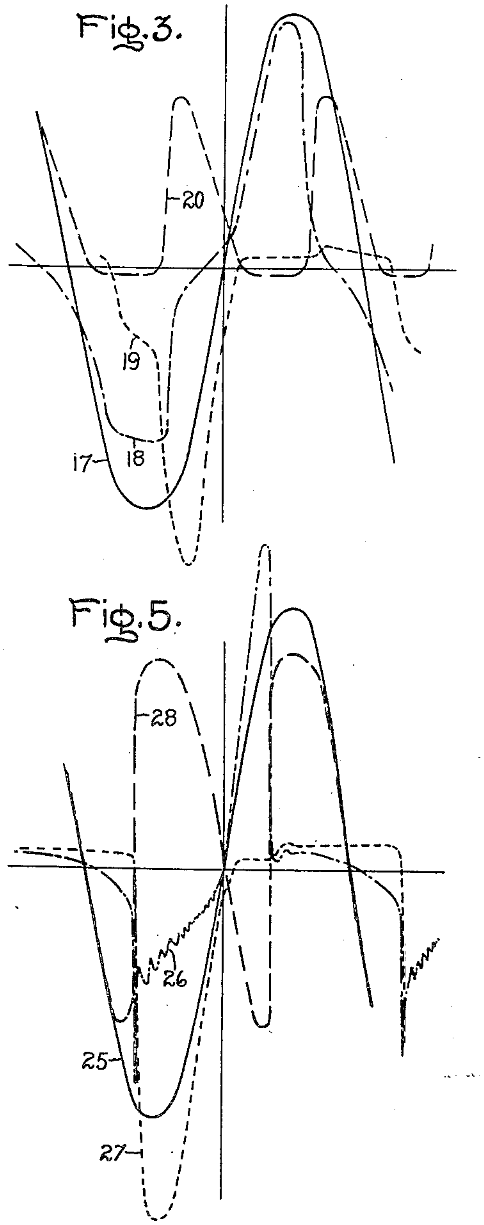
Fig. 3. Fig. 5.
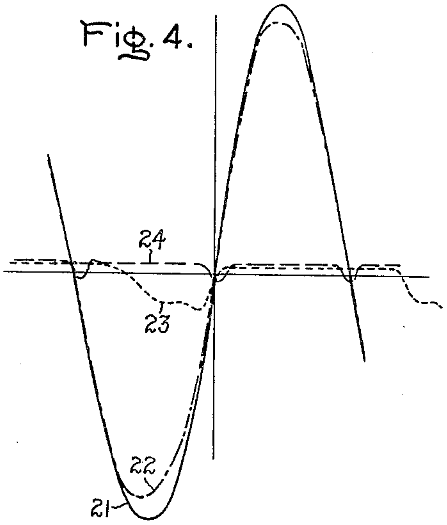
Fig. 4.
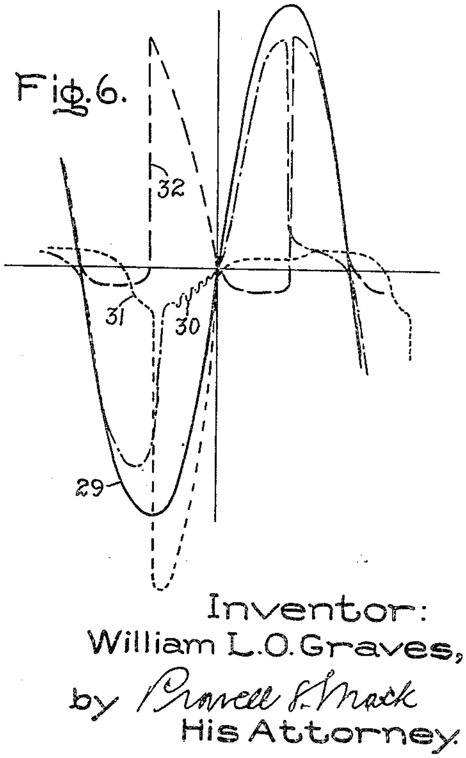
Fig. 6.
Inventor:
William L.O. Graves,
by Ernest S. Mack
His Attorney.

Patented July 25, 1950

2,516,563

UNITED STATES PATENT OFFICE 2,516,563

MAGNETIC AMPLIFIER FOR INDUCTIVE LOADS

William L. O. Graves, Ballston Spa, N. Y., assignor to General Electric Company, a corporation of New York Application April 19, 1948, Serial No. 21,784

3 Claims. (Cl. 321—43)

This invention relates to magnetic amplifiers, and in particular to improvements enabling the use of regenerative-type magnetic amplifiers with inductive loads.

Regenerative-type magnetic amplifiers have been developed capable of producing a relatively large direct current output responsive to feeble direct current input signals, which depend for their operation upon saturation of a magnetic core by the input signal, thereby changing the impedance of reactor coils wound upon such core. With such devices, amplified direct voltage variations are produced across a load which correspond, in a substantially linear manner within the operating range of the apparatus, to changes in the D.-C. input signal. A large gain is obtained by placing rectifiers in series with the reactor coils so that the current through these coils has a D.-C. component which aids in saturating the magnetic core, and thus provides regenerative action. In these amplifiers, many circuit variations are possible: for every type rectifier circuit there is a corresponding regenerative-type magnetic amplifier circuit. These amplifiers work well when the load or output impedance into which they operate is essentially resistive, but fail to operate properly when such load is highly inductive, for reasons which are hereinafter more fully explained. Previously the usual practice has been to overcome this difficulty by placing a large resistance in series with the load, so that the total impedance of the resistance plus the load is essentially resistive. However, this greatly reduces the effective gain of the amplifier since a substantial part of the output is lost in the resistor.

An object of this invention is to provide improved means for operating a regenerative type magnetic amplifier with an inductive load. Further objects and advantages will become apparent as the description proceeds.

The features of the invention which are believed to be novel and patentable are pointed out in the claims forming a part of this specification. For a better understanding of the invention, reference is made in the following description to the accompanying drawing, in which Fig. 1 is a schematic diagram illustrating a preferred embodiment of the invention; Fig. 2 is a schematic diagram of a regenerative-type magnetic amplifier previously known; and Figs. 3 through 6 are diagrams illustrating voltage waveforms which will be used in describing the operating principles and advantages of this invention. Like reference numbers indicate like parts throughout the drawing.

Referring now to Fig. 1, an improved regenerative-type magnetic amplifier is illustrated in which terminals 1 may be connected to an alternating current source, such as a 60 cycle commercial outlet or an oscillator for producing electric current at a higher frequency; an autotransformer 2 is adapted to provide voltages at its terminals 4 and 5 which are equal but 180° out of phase with each other, and also has a neutral terminal 6 at the center tap of the transformer. In place of the autotransformer, it is possible to use a two-winding transformer having a center-tapped secondary, or any alternating current source having first and second terminals for providing two voltages 180° out of phase with each other and also having a third neutral terminal. In a bridge-type magnetic amplifier, the neutral terminal may be omitted, as is done in bridge-type rectifier circuits.

A saturable magnetic element 7 as illustrated comprises two rings of saturable magnetic material. However, it is known in the art that three-legged and other forms of magnetic cores will also give good results in a magnetic amplifier circuit, and it will be appreciated that my invention is not limited to the form illustrated. Reactor cores 8 and 9 are respectively wound upon different portions of element 7 and are connected as shown to terminals 4 and 5 and to two rectifiers 10 and 11. A third rectifier 12 has a common connection to rectifiers 10 and 11 and is also connected as shown to the neutral terminal 6 of autotransformer 2. It can be seen that reactor 8, rectifier 10, and rectifier 12 are electrically connected in series between terminal 4 and neutral terminal 6; and that reactor 9, rectifier 11, and rectifier 12 are electrically connected in series between terminal 5 and neutral terminal 6. The polarities of rectifiers 10, 11, and 12 are such that rectifier 10 opposes current flow in the direction of terminal 4, rectifier 11 opposes current flow in the direction of terminal 5, and rectifier 12 opposes current flow in the direction of terminal 6. Connections 13 and 14 are provided for connecting a load 15 in parallel with rectifier 12. An input signal coil 16 is wound about both rings of magnetic element 7 as shown.

The alternating voltages at terminals 4 and 5 cause pulsating currents to flow through coil 8, rectifier 10 and load 15; and through coil 9, rectifier 11 and load 15. Because of the action of rectifiers 10 and 11, these currents have a substantial D.-C. component. These D.-C. components of current flowing through coils 8 and 9 produce in saturable magnetic element 7 unidirectional magnetic flux which tends to saturate element 7. An input signal current flowing through coil 16 will produce an additional magnetic flux which will either increase or decrease the degree of saturation of element 7, depending upon the direction of current flow through coil 16. These changes in the degree of saturation of element 7 cause changes in the impedance of coils 8 and 9, which in turn cause changes in the amount of current flowing through the circuit and through load 15. These changes in the amount of current flowing through coils 8 and 9 in turn affect the amount of unidirectional flux in, and hence the saturation of, element 7. Thus a regenerative action results which provides a relatively large change in the current flowing through load 15 for a very small change in current flowing through coil 16. The operation of rectifier 12 is hereafter described in connection with Figs. 3 through 6.

Refer now to Fig. 2, which is a conventional representation of a form of regenerative magnetic amplifier heretofore known. It will be noted that the circuit of Fig. 2 is essentially the same as the circuit of Fig. 1, except that rectifier 12 is not included. A two-winding transformer 2' having a primary and a center-tapped secondary replaces autotransformer 2; but this does not affect the operation of the circuit, which is substantially as hereinbefore described in connection with Fig. 1. The operation of this circuit is satisfactory so long as the impedance of load 15 is essentially resistive, as will be explained by the waveforms of Fig. 3; but is unsatisfactory when the impedance of load 15 is highly inductive, as will be explained by the waveforms of Figs. 4 and 5.

Referring now to Fig. 3, the sinusoidal curve 17 represents the waveform of voltage applied to terminals 1, Fig. 2. The voltage at terminal 4 has the same waveform; and the voltage at terminal 5 is the same, but shifted 180° in phase. In the description that follows, the series circuit between terminals 4 and 6, Fig. 2, will be considered. It is understood that the voltages in the series circuit between terminals 5 and 6 are the same, but shifted 180° in phase. Since curve 17 represents the voltage applied to this series circuit, it must be equal to the sum of the voltage drops across the various impedances in the circuit. These voltage drops are respectively illustrated by curve 18 representing the voltage drop across reactor 8, curve 19 representing the voltage drop across rectifier 10, and curve 20 representing the voltage drop across load 15. As the degree of saturation of the magnetic element is varied responsive to changes in the current through winding 16, the impedance of reactor 8 changes, and the amplitude of curve 18 changes accordingly. The amplitudes of curves 19 and 20 also change, since the three curves must always add up to the value shown by curve 17; but the waveforms remain substantially as shown. Note that the voltage across rectifier 10 is positive, permitting current flow through the rectifier, during approximately one-half of each cycle. But the reactance of coil 8 delays the start of current flow, so that the actual pulse of current is substantially narrower than one-half cycle, as is shown by curve 20, which, being the voltage drop across the resistive load, is proportional to current. Two such current pulses occur each cycle, due to current flow through rectifiers 10 and 11 respectively. Between pulses the current is completely interrupted, which in turn interrupts the magnetic flux in element 7 produced by such current. During these interruptions, the relatively weak current flowing through coil 16 regains control of the saturating flux in element 7, so that takeover by the D.-C. current flowing in the reactor windings is prevented, and operation of the amplifier is stable over the full range of input signal current values.

Refer now to Fig. 4, which shows the corresponding waveforms of the circuit of Fig. 2 when the impedance of load 15 is highly inductive, and the saturable magnetic element is operated well below saturation representing a very small or zero current in coil 16. Curve 21 represents the voltage at terminal 4, curve 22 represents the voltage drop across reactor 8, curve 23 the voltage drop across rectifier 10, and curve 24 the voltage drop across load 15. It is noted that the waveform of curve 24, representing the voltage drop across load 15, is quite different from the waveform of the corresponding curve in Fig. 3, because, due to the inductive character of the load, the voltage drop across the load is no longer in phase with the current through the load. However, since the magnetic element is substantially unsaturated, the reactance of coil 8 is high and most of the voltage drop occurs across reactor 8 as shown by curve 22. Although in this particular case, the reactive nature of load 15 thus has little effect upon the circuit, it is notable that the voltage drop across rectifier 10, represented by curve 23, is positive for considerably more than one-half of a cycle. There is thus a substantial overlap of the respective conductive periods of rectifiers 10 and 11, so that there is no time during the cycle when current does not flow through the circuit. In this case, stability is achieved only by the fact that the current flowing is too small in value to saturate element 7.

Refer now to Fig. 5, which shows the waveforms which occur in the circuit of Fig. 2 with an inductive load when the input signal is increased sufficiently to cause saturation of the magnetic element. Curve 25 represents the voltage at terminal 4; curve 26 represents the voltage drop across reactor 8; curve 27 represents the voltage drop across rectifier 10; and curve 28 the voltage drop across load 15. In this case large currents are flowing through the load; and because of its inductive character load 15 tends to oppose any change in value of these currents during that portion of the cycle when the voltage across rectifier 10 would otherwise become negative and prevent further current flow through the rectifier and the circuit. Any decrease in the current flowing produces a negative voltage across load 15 which opposes the change in voltage across rectifier 10, thus maintaining a positive voltage drop across the rectifier so that current flows through the rectifier for more than one-half of each cycle. Correspondingly, current flows through rectifier 11 for more than one-half of each cycle so that there is an overlap of the respective periods during which current flows through each rectifier. Thus the current through the circuit is never interrupted; and consequently, current flowing through reactors 8 and 9 produces an uninterrupted unidirectional flux which maintains magnetic element 7 in a continuous state of saturation. Under these conditions, the relatively feeble currents flowing in coil 16 cannot effectively control the circuit. The circuit of Fig. 2, therefore, when operating with an inductive load, has only two stable states of operation: that illustrated by the curves of Fig. 4, and that illustrated by the curves of Fig. 5. No inbetween state is possible, since a small increase in the signal voltage above that present in the operating state illustrated in Fig. 4 will cause the D.-C. current in the reactor windings to take over and produce the operating state shown in Fig. 5. This characteristic has heretofore greatly restricted the use of magnetic amplifiers of the type described.

If now, in accordance with my invention, a rectifier 12 is added to the circuit, as illustrated in Fig. 1, the stable mode of operation illustrated by the curves of Fig. 6 is obtained. Referring now to Fig. 6, curve 29 represents the voltage at terminal 4, curve 30 the voltage drop across reactor 8, curve 31 the voltage drop across rectifier 10, and curve 32 represents the voltage drop across load 15. By comparison of Figs. 5 and 6, it is seen that the action of rectifier 12 is to limit the negative voltage across inductive load 15 and establish a mode of operation similar to that found when the impedance of load 15 is resistive. Since the voltage across load 15 is prevented by rectifier 12 from going strongly negative, it can not maintain a positive voltage across rectifier 10 after the time when such voltage would normally become negative to stop current flow in the circuit, so that current flow is interrupted twice during each cycle just as occurred when the load was resistive. During these interruptions of current flow, the saturating unidirectional flux of element 7 is also interrupted; so that during these periods the feeble current flowing in coil 16 again regains control of the circuit, and stable operation is obtained over the full range of input signal current values.

It will be appreciated that my invention is generally applicable to regenerative magnetic amplifiers of the full-wave rectifying type, and is not restricted to the particular amplifier circuit described.

Having described the principle of the invention and the best mode in which I have contemplated applying that principle, I wish it to be understood that the apparatus described is illustrative only, and that other means can be employed without departing from the true scope of the invention defined in the following claims.

What I claim as new and desire to secure by Letters Patent of the United States:

1. In a magnetic amplifier for producing amplified direct voltage variations across a load which correspond to changes in a D.-C. input signal, the combination of output terminals to which the load may be connected, A.-C. supply connections and rectifying means connected to the output terminals with the polarities arranged to permit unidirectional current flow through the load and to oppose current flow in the opposite direction, a saturable magnetic element having reactor windings connected in series with said A.-C. supply connections and rectifying means, input terminals, a signal winding on said magnetic element connected to said input terminals, and an additional rectifier connected in parallel with such load and having a polarity to oppose flow of such unidirectional current through said additional rectifier.

2. A magnetic amplifier comprising an alternating current source having first and second terminals for providing two voltages 180° out of phase with each other and a third neutral terminal, a saturable magnetic element including first and second reactor windings, first, second, and third rectifiers, said first reactor and first and third rectifiers being electrically connected in series between said first and third terminals, said second reactor and second and third rectifiers being electrically connected in series between said second and third terminals, said first, second, and third rectifiers having their polarities arranged to oppose current flow to said first, second, and third terminals respectively, electrical connections for connecting a load in parallel with said third rectifier, so that D.-C. components of current flow through said reactors and such load and produce a unidirectional magnetic flux in the saturable magnetic element which tends to saturate said element, and means to produce in said element an additional magnetic flux responsive to an input signal.

3. A regenerative magnetic amplifier for providing direct voltage variations across a load which correspond to changes in a D.-C. input signal, having output terminals to which the load may be connected, A.-C. supply connections, a saturable magnetic element, reactor windings on said element, and full-wave rectifying means, said reactor windings and rectifying means being connected between said A.-C. supply connections and said output terminals, signal input terminals, and a signal winding on said magnetic element connected to said input terminals, so that unidirectional current flows through the reactor winding, the rectifying means and the load, characterized by the fact that an additional rectifier is connected between said output terminals and in parallel with the load with a polarity to oppose flow of said unidirectional current through said additional rectifier.

WILLIAM L. O. GRAVES.

REFERENCES CITED

The following references are of record in the file of this patent:

UNITED STATES PATENTS

| Number | Name | Date |
|---|---|---|
| 1,679,448 | Smith | Aug. 7, 1928 |
| 1,725,709 | Geiger | Aug. 20, 1929 |
| 1,857,160 | McEachron | May 10, 1932 |
| 2,199,121 | Walsh | Apr. 30, 1940 |
| 2,329,021 | Walsh | Sept. 7, 1943 |